(12) United States Patent
Kawano et al.

(10) Patent No.: US 7,816,282 B2
(45) Date of Patent: Oct. 19, 2010

(54) METHOD FOR FORMING SRTIO₃ FILM

(75) Inventors: Yumiko Kawano, Nirasaki (JP);
Akinobu Kakimoto, Nirasaki (JP);
Hidekimi Kadokura, Tokyo (JP);
Shintaro Higashi, Tsurugashima (JP)

(73) Assignee: Tokyo Electron Limited, Tokyo (JP)

( * ) Notice: Subject to any disclaimer, the term of this patent is extended or adjusted under 35 U.S.C. 154(b) by 262 days.

(21) Appl. No.: 12/019,262

(22) Filed: Jan. 24, 2008

(65) Prior Publication Data

US 2008/0175994 A1 Jul. 24, 2008

(30) Foreign Application Priority Data

Jan. 24, 2007 (JP) .............................. 2007-013286

(51) Int. Cl.
*H01L 21/31* (2006.01)
*H01L 21/469* (2006.01)
(52) U.S. Cl. .............................. 438/778; 257/E21.646; 427/255.36
(58) Field of Classification Search ................. 438/778; 257/E21.646; 427/255.36
See application file for complete search history.

(56) References Cited

U.S. PATENT DOCUMENTS 5,006,363 A * 4/1991 Fujii et al. ................... 427/571

7,108,747 B1 9/2006 Leskelä et al.

FOREIGN PATENT DOCUMENTS

JP 7-249616 9/1995

OTHER PUBLICATIONS

Feil et al. "Organometallic chemical vapor deposition of strontium titanate", Journal of Applied Physics, vol. 67, No. 8, Apr. 15, 1990 p. 3858.*
Chemically Conformal ALD of SrTiO₃ Thin Films Using Conventional Metalorganic Precursors; Oh Seong Kwon, et al.: Journal of the Electrochemical Society, 152 (4) C229-C236 (2005).

* cited by examiner

*Primary Examiner*—W. David Coleman
*Assistant Examiner*—Sonya D McCall-Shepard
(74) *Attorney, Agent, or Firm*—Oblon, Spivak, McClelland, Maier & Neustadt, L.L.P.

(57) ABSTRACT

A method is used for forming an SrTiO₃ film on a substrate placed and heated inside a process chamber while supplying a gaseous Ti source material, a gaseous Sr source material, and a gaseous oxidizing agent into the process chamber. $Sr(C_5(CH_3)_5)_2$ is used as the Sr source material. The method performs a plurality of cycles to form the SrTiO₃ film. Each cycle sequentially includes supplying the gaseous Ti source material into the process chamber and thereby adsorbing it onto the substrate; supplying the gaseous oxidizing agent into the process chamber and thereby decomposing the Ti source material thus adsorbed and forming a Ti-containing oxide film; supplying the gaseous Sr source material into the process chamber and thereby adsorbing it onto the Ti-containing oxide film; and supplying the gaseous oxidizing agent into the process chamber and thereby decomposing the Sr source material thus adsorbed and forming an Sr-containing oxide film.

15 Claims, 4 Drawing Sheets

| | Sr supply | | | | Ti supply | | | | Oxygen supply | Film formation | | | |
|---|---|---|---|---|---|---|---|---|---|---|---|---|---|
| | Source material | Method | TG1 (°C) | TP (°C) | Source material | Method | TG2 (°C) | Source material | Method | Temperature (°C) | Pressure (Torr) | Rate (nm/100cycles) |
| PE1 | Sr(C$_5$(CH$_3$)$_5$)$_2$ | Bubbling | 150 | 155 | Ti(iOPr)$_4$ | Bubbling | 40 | H$_2$O | ALD | 320 | 0.3 | 12 |
| PE2 | Sr(C$_5$(CH$_3$)$_5$)$_2$ | Bubbling | 150 | 155 | Ti(iOPr)$_4$ | Bubbling | 40 | H$_2$O | ALD | 340 | 0.7 | 11 |
| PE3 | Sr(C$_5$(CH$_3$)$_5$)$_2$ | Toluene Dilute DLI | 150 | 155 | Ti(iOPr)$_4$ | Bubbling | 40 | H$_2$O | ALD | 330 | 0.8 | 13 |
| PE4 | Sr(C$_5$(CH$_3$)$_5$)$_2$ | Bubbling | 150 | 155 | Ti(iOPr)$_4$ | Bubbling | 40 | O$_3$ | ALD | 320 | 0.3 | 13 |
| CE1 | Sr(DPM)$_2$ | Bubbling | 200 | 180 | Ti(iOPr)$_4$ | Bubbling | 40 | O$_3$ | ALD | 320 | 0.3 | 3 |
| CE2 | Sr(DPM)$_2$ | THF Dilute DLI | 310 | 180 | Ti(iOPr)$_4$ | THF Dilute DLI | 310 | O$_3$ | ALD | 350 | 1 | 6 |
| CE3 | Sr(DPM)$_2$ | THF Dilute DLI | 310 | 320 | Ti(iOPr)$_4$ | THF Dilute DLI | 310 | O$_3$ | ALD | 350 | 1 | 12 |
| CE4 | Sr(C$_5$(CH$_3$)$_5$)$_2$ | THF Dilute DLI | 130 | 135 | Ti(iOPr)$_4$ | Bubbling | 40 | O$_2$ | CVD | 600 | 10 | 4 |

FIG.4

METHOD FOR FORMING SRTIO₃ FILM

BACKGROUND OF THE INVENTION

1. Field of the Invention

The present invention relates to a method for forming an $SrTiO_3$ film and a computer readable storage medium.

2. Description of the Related Art

In recent years, integrated circuits for semiconductor devices have been increasingly highly integrated, so DRAMs are required to have memory cells with a smaller surface area and a larger storage capacity. Due to such requirement, capacitors having an MIM (metal-insulator-metal) structure have attracted attention. In a capacitor having an MIM structure of this kind, a high dielectric constant material, such as strontium titanate ($SrTiO_3$), is used as an insulating film (dielectric film).

Conventionally, where an $SrTiO_3$ film for a DRAM capacitor is formed, $Sr(DPM)_2$ is used as an Sr source material. However, $Sr(DPM)_2$ has a low vapor pressure and a low adsorption rate on a substrate surface, and thus entails a problem in that the film formation rate is very low and thereby provides low throughput. In order to supply $Sr(DPM)_2$ in a gaseous phase, this material needs to be heated to a temperature higher than 200° C., Accordingly, a heat-resistant material needs to be used for the piping lines, thereby increasing the apparatus cost.

As a technique to solve this problem, Jpn. Pat. Appln. KOKAI Publication No. 7-249616 (Patent Document 1) discloses a technique for forming an $SrTiO_3$ film by use of $Sr(C_5(CH_3)_5)_2$ as an Sr source material. This document describes that an Sr compound containing $Sr(C_5(CH_3)_5)_2$ is dissolved in an organic solvent to form a liquid source material, which is then vaporized and supplied into a reaction chamber, so that the material is decomposed near a substrate surface to deposit an Sr-containing dielectric film on the substrate surface (claim 1 and so forth). Further, this document describes that an $SrTiO_3$ film is formed by supplying an Sr compound and an organic metal complex substantially containing Ti (claim 9 and so forth).

In recent years, the aspect ratio of holes used for forming DRAM capacitors has been increased. In this respect, it has been found that, where an $SrTiO_3$ film is formed by the method using the Sr source material and substrate disclosed in Patent Document 1 described above, the reaction is preferentially caused on the substrate surface and does not provide a good coverage inside holes having a high aspect ratio. Further, where an Sr source material and a Ti source material are supplied substantially at the same time, the reaction can be hardly uniformly caused to make a uniform composition over the top, side, and bottom surfaces of holes having a high aspect ratio.

BRIEF SUMMARY OF THE INVENTION

An object of the present invention is to provide a method for forming an $SrTiO_3$ film, which can gasify a source material at a low temperature of 200° C. or less and can form a film with high throughput so that the film has a uniform composition with high coverage inside holes having a high aspect ratio.

Another object of the present invention is to provide a computer readable storage medium that stores a control program for executing this method.

According to a first aspect of the present invention, there is provided an $SrTiO_3$ film forming method for forming an $SrTiO_3$ film on a substrate placed and heated inside a process chamber while supplying a gaseous Ti source material, a gaseous Sr source material, and a gaseous oxidizing agent into the process chamber, wherein $Sr(C_5(CH_3)_5)_2$ is used as the Sr source material, and the method is arranged to perform a plurality of cycles to laminate thin films respectively formed by the cycles, thereby forming the $SrTiO_3$ film with a predetermined thickness, each of the cycles sequentially comprising: supplying the gaseous Ti source material into the process chamber and thereby adsorbing the gaseous Ti source material onto the substrate; supplying the gaseous oxidizing agent into the process chamber and thereby decomposing the Ti source material thus adsorbed and forming a Ti-containing oxide film; supplying the gaseous Sr source material into the process chamber and thereby adsorbing the gaseous Sr source material onto the Ti-containing oxide film; and supplying the gaseous oxidizing agent into the process chamber and thereby decomposing the Sr source material thus adsorbed and forming an Sr-containing oxide film.

In the first aspect, each of the cycles preferably comprises purging an interior of the process chamber between said supplying steps. The Sr source material may be supplied by bubbling while being heated to a temperature of 150 to 230° C. The Sr source material may be dissolved in a solvent, and vaporized in a vaporizer for supply while being heated to a temperature of 150 to 230° C. The solvent preferably contains no oxygen. Typically, the solvent is a hydrocarbon. The solvent is most preferably toluene. The oxidizing agent is preferably $H_2O$.

According to a second aspect of the present invention, there is provided a computer readable storage medium that stores a control program for execution on a computer for controlling a film forming apparatus, wherein the control program, when executed, causes the computer to control the film forming apparatus to perform the method according to the first aspect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 4 is a diagram showing the results of present examples PE1 to PE4 and comparative examples CE1 to CE4.

DETAILED DESCRIPTION OF THE INVENTION

An embodiment of the present invention will now be described with reference to the accompanying drawings.

Figure 1:
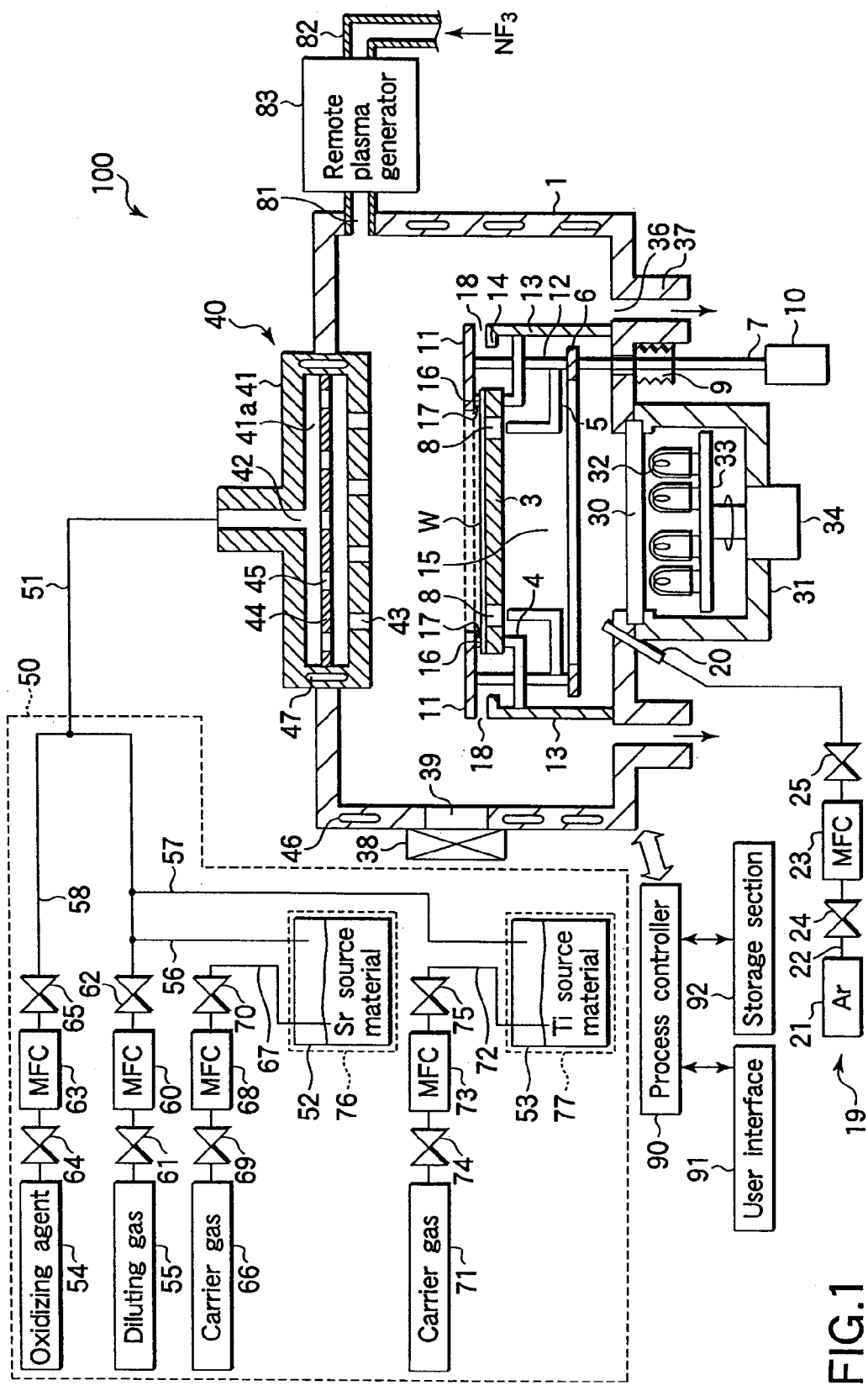
FIG. 1 is a sectional view schematically showing the structure of a film forming apparatus usable for performing a film formation method according to an embodiment of the present invention.

FIG. 1 is a sectional view schematically showing the structure of a film forming apparatus usable for performing a film formation method according to an embodiment of the present invention. The film forming apparatus 100 shown in FIG. 1 includes a cylindrical or box like process chamber 1 made of, e.g., aluminum. A worktable 3 is disposed inside the process chamber 1 to place a target substrate or semiconductor wafer W thereon. For example, the worktable 3 is made of a carbon material or an aluminum compound, such as aluminum nitride, and has a thickness of about 1 mm.

A cylindrical partition wall 13 made of, e.g., aluminum stands on the bottom of the process chamber 1 and surrounds the worktable 3. The partition wall 13 has a bent portion 14 at the top, which is bent in, e.g., a horizontal direction to form an L-shape. The cylindrical partition wall 13 is disposed to form an inactive gas purge space 15 on the backside of the worktable 3. The upper surface of the bent portion 14 is essentially leveled with the upper surface of the worktable 3 and separated from the outer perimeter of the worktable 3 with connecting rods 12 inserted therebetween. The worktable 3 is supported by three support arms 4 (only two of them are shown in FIG. 1) extending from upper portions on the inner side of the partition wall 13.

A plurality of, e.g., three, L-shape lifter pins 5 (only two of them are shown in FIG. 1) are extended upward from a ring support member 6 below the worktable 3. The support member 6 is movable up and down by an elevating rod 7, which penetrates the bottom of the process chamber 1 and is moved up and down by an actuator 10 located below the process chamber 1. The worktable 3 has insertion through holes 8 at positions corresponding to the lifter pins 5, so that lifter pins 5 can project from the insertion holes 8 to lift up the semiconductor wafer W when the lifter pins 5 are moved up by the actuator 10 through the elevating rod 7 and support member 6. The portion of the process chamber 1 where the elevating rod 7 is inserted is covered with a bellows 9 to prevent outside gas from entering the process chamber 1 through this portion.

A clamp ring member 11 is disposed around the outer perimeter of the worktable 3 to hold and fix the outer peripheral portion of the semiconductor wafer W onto the worktable. For example, the clamp ring member 11 essentially has a ring shape conforming to the contour shape of the circular semiconductor wafer W, and is made of a ceramic, such as aluminum nitride. The clamp ring member 11 is connected to the support member 6 through the connecting rods 12, so that it is moved up and down integratedly with the lifter pins 5. The lifter pins 5 and connecting rods 12 are made of a ceramic, such as alumina.

The clamp ring member 11 has a plurality of contact protrusions 16 arrayed at essentially regular intervals in an annular direction on the lower surface at positions near the inner perimeter. When the semiconductor wafer W is clamped, the lower ends of the contact protrusions 16 come into contact with the upper surface of the outer peripheral portion of the semiconductor wafer W to push it. Each of the contact protrusions 16 has a diameter of about 1 mm and a height of about 50 μm, so that a first gas purge gap 17 having a ring shape is formed at this portion when the semiconductor wafer W is clamped. When the semiconductor wafer W is clamped, the overlap amount of the outer peripheral portion of the semiconductor wafer W with the inner peripheral portion of the clamp ring member 11 (the passage length of the first gas purge gap 17) is about several millimeters.

The outer perimeter of the clamp ring member 11 is located above the top bent portion 14 of the partition wall 13 to form a second gas purge gap 18 having a ring shape therebetween. The second gas purge gap 18 has a width of, e.g., about 500 μm, which is about ten times larger than the width of the first gas purge gap 17. The overlap amount of the peripheral portion of the clamp ring member 11 with the bent portion 14 (the passage length of the second gas purge gap 18) is about 10 mm. With this arrangement, an inactive gas can flow out from inside the inactive gas purge space 15 through both of the gaps 17 and 18 into the process space.

The bottom of the process chamber 1 is connected to an inactive gas supply mechanism 19 for supplying an inactive gas into the inactive gas purge space 15. The gas supply mechanism 19 includes a gas nozzle 20 for delivering an inactive gas, such as Ar gas, into the inactive gas purge space 15, an Ar gas supply source 21 for supplying the inactive gas or Ar gas, and a gas line 22 for guiding the Ar gas from the Ar gas supply source 21 to the gas nozzle 20. The gas line 22 is provided with a flow rate controller, such as a mass-flow flow controller 23, and switching valves 24 and 25. The inactive gas may be He gas in place of Ar gas.

The bottom of the process chamber 1 has a transmission window 30 made of a heat ray transmission material, such as quartz, and airtightly attached thereto at a position directly below the worktable 3. A box like heating chamber 31 is connected to the bottom of the process chamber 1 to surround the transmission window 30 from below. The heating chamber 31 contains a heating device comprising a plurality of heating lamps 32 mounted on a rotary table 33 serving as a reflector as well. The rotary table 33 is rotatable through a rotary shaft by a rotating motor 34 attached to the bottom of the heating chamber 31. Heat rays emitted from the heating lamps 32 are transmitted through the transmission window 30 onto the backside of the worktable 3, so that the worktable 3 is heated.

The bottom of the process chamber 1 has an exhaust port 36 formed near the outer perimeter and connected to a vacuum pump (not shown) through an exhaust line 37. The interior of the process chamber 1 can be set at a predetermined vacuum level when it is exhausted by the pump through the exhaust port 36 and exhaust line 37. The process chamber 1 has a transfer port 39 formed in the sidewall and provided with a gate valve 38 for opening/closing the transfer port 39, so that the semiconductor wafer W is transferred through the transfer port 39.

On the other hand, a showerhead 40 for supplying a source gas and so forth into the process chamber 1 is disposed on the ceiling of the process chamber 1 to face the worktable 3. The showerhead 40 includes a disk-like head main body 41 made of, e.g., aluminum and having an inner space 41a. The head main body 41 has a gas feed port 42 at the ceiling. The gas feed port 42 is connected through a line 51 to a process gas supply mechanism 50 for supplying process gases necessary for forming an $SrTiO_3$ film. The head main body 41 has a number of gas spouting holes 43 formed all over the bottom, so that a gas supplied into the head main body 41 is delivered through the holes 43 to the entire surface of the semiconductor wafer W in the process space inside the process chamber 1. The space 41a inside the head main body 41 is provided with a distribution plate 44 disposed therein and having a number of gas distribution holes 45, so that a gas is uniformly supplied onto the surface of the semiconductor wafer W. Further, the sidewall of the process chamber 1, the sidewall of the showerhead 40, and the wafer counter surface of the showerhead 40 having the gas spouting holes 43 are provided with cartridge heaters 46 and 47 built therein to adjust the temperature, so that the sidewalls and showerhead portions can be maintained at a predetermined temperature while they are in contact with the gas.

The process gas supply mechanism 50 includes an Sr source material reservoir 52 that stores an Sr source material, a Ti source material reservoir 53 that stores a Ti source material, an oxidizing agent supply source 54 for supplying an oxidizing agent, and a diluting gas supply source 55 for supplying a diluting gas, such as argon gas, for diluting the gas inside the process chamber 1.

The line 51 connected to showerhead 40 is connected to a line 56 extending from the Sr source material reservoir 52, a line 57 extending from the Ti source material reservoir 53, and a line 58 extending from the oxidizing agent supply source 54. The line 51 is further connected to the diluting gas supply source 55 through a flow rate controller, such as a mass-flow controller (MFC) 60, and switching valves 61 and 62 one on either sides of the MFC 60. The line 58 is provided with a flow rate controller, such as a mass-flow controller (MFC) 63, and switching valves 64 and 65 one on either sides of the MFC 63.

The Sr source material reservoir 52 is connected through a line 67 to a carrier gas supply source 66 for supplying a carrier gas, such as Ar, for bubbling. The line 67 is provided with a flow rate controller, such as a mass-flow controller (MFC) 68, and switching valves 69 and 70 one on either sides of the MFC 68. The Ti source material reservoir 53 is connected through a line 72 to a carrier gas supply source 71 for supplying a carrier gas, such as Ar. The line 72 is provided with a flow rate controller, such as a mass-flow controller (MFC) 73, and switching valves 74 and 75 one on either sides of the MFC 73. The Sr source material reservoir 52 and Ti source material reservoir 53 are respectively provided with heaters 76 and 77. The Sr source material stored in the Sr source material reservoir 52 and the Ti source material stored in the Ti source material reservoir 53 are heated by the heaters 76 and 77 while they are supplied by bubbling to the process chamber 1. Although not shown, the piping lines for supplying the Sr source material and Ti source material in a vaporized state are also provided with heaters.

As the Sr source material, $Sr(C_5(CH_3)_5)_2$ is used. $Sr(C_5(CH_3)_5)_2$ has a higher vapor pressure than $Sr(DPM)_2$ that is conventionally employed, and thus can be supplied in a gaseous phase state at a sufficient supply rate, thereby providing high throughput. Hence, $Sr(C_5(CH_3)_5)_2$ is suitable as the source material of an $SrTiO_3$ film.

As the Ti source material, $Ti(OiPr)_4$, $Ti(OiPR)_2(DPM)_2$, or the like that is conventionally used can be preferably used.

As the oxidizing agent, $O_3$ gas, $O_2$ gas, or $H_2O$ that is conventionally used can be used as a single gas or a combination of the gases. Alternatively, $O_2$ gas plasma may be used for the same purpose. Of them, $H_2O$ is most preferable in light of an increase in the purity of an $SrTiO_3$ film, as described later.

The sidewall of the process chamber 1 has a cleaning gas feed portion 81 at an upper position for feeding $NF_3$ gas as a cleaning gas. The cleaning gas feed portion 81 is connected to a line 82 for supplying $NF_3$ gas, which is provided with a remote plasma generator 83. $NF_3$ gas flowing through the line 82 is turned into plasma in the remote plasma generator 83, and is supplied into the process chamber 1, when cleaning is performed inside the process chamber 1. A remote plasma generator 83 may be disposed directly above the showerhead 40, so that cleaning gas is supplied through the showerhead 40. In place of $NF_3$, $F_2$ may be used. In place of the remote plasma, plasma-less thermal cleaning using, e.g., $ClF_3$ may be performed.

The film forming apparatus 100 includes a process controller 90 comprising a microprocessor (computer), which is connected to and controls the respective components in the film forming apparatus 100. The process controller 90 is connected to the user interface 91, which includes, e.g., a keyboard and a display, wherein the keyboard is used for an operator to input commands for operating the respective components in the film forming apparatus 100, and the display is used for showing visualized images of the operational status of the respective components in the film forming apparatus 100. Further, the process controller 90 is connected to a storage section 92 that stores various databases and recipes, i.e., control programs for the process controller 90 to control the film forming apparatus 100 so as to perform various processes, and control programs for the respective components of the film forming apparatus 100 to perform predetermined processes in accordance with process conditions. The recipes are stored in a storage medium included in the storage section 92. The storage medium may be formed of a medium of the stationary type, such as a hard disk, or a medium of the portable type, such as a CDROM, DVD, or flash memory. Alternatively, the recipes may be used online while they are transmitted from another apparatus through, e.g., a dedicated line, as needed.

A required recipe is retrieved from the storage section 92 and executed by the process controller 90 in accordance with an instruction or the like input through the user interface 91. Consequently, the film forming apparatus 100 can perform a predetermined process under the control of the process controller 90.

Next, an explanation will be given of a film forming method performed in the film forming apparatus having the structure described above.

At first, the gate valve 38 is opened, and a semiconductor wafer W is loaded through the transfer port 39 into the process chamber 1 and placed on the worktable 3. The semiconductor wafer W is heated by the worktable 3, which has been heated by heat rays emitted from the heating lamps 32 and transmitted through the transmission window 30. Then, a diluting gas, such as Ar gas, is supplied from the diluting gas supply source 55 at a flow rate of 100 to 800 mL/min (sccm). At the same time, the interior of the process chamber 1 is vacuum-exhausted by the vacuum pump (not shown) through the exhaust port 36 and exhaust line 37, to set the pressure inside the process chamber 1 at about 39 to 665 Pa. Further, at this time, the semiconductor wafer W is heated to a temperature of, e.g., 200 to 400° C.

Then, the flow rate of the diluting gas, such as Ar gas, is set to be 100 to 500 mL/min (sccm), and the pressure inside the process chamber 1 is adjusted to a film formation pressure of 39 to 266 Pa, to start actual film formation. The pressure inside the process chamber 1 is adjusted by an automatic pressure controller (APC) disposed on the exhaust line 37.

Figure 2:
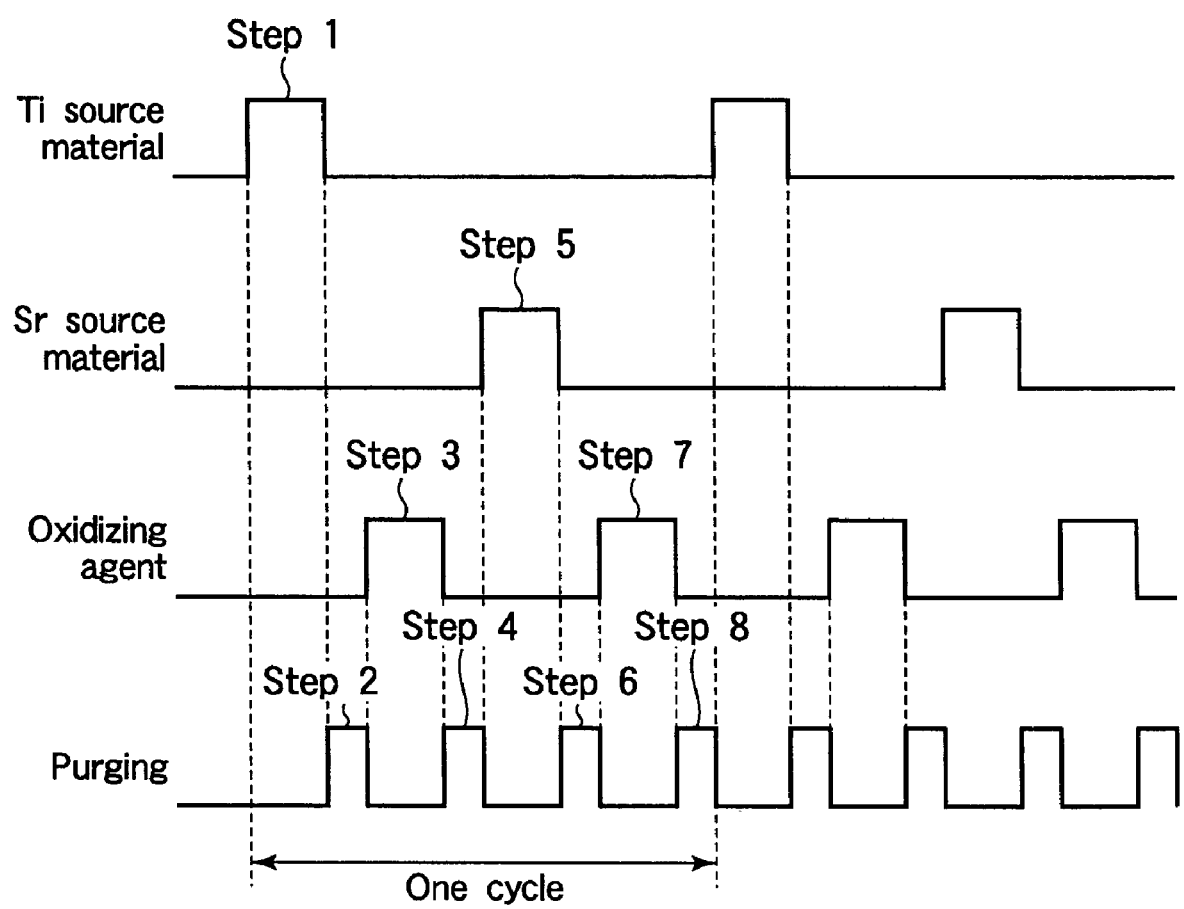
FIG. 2 is a view showing a process sequence of the film formation method according to an embodiment of the present invention.

In the actual film formation, an ALD method with the sequence shown in FIG. 2 is used. At first, the Ti source material, such as $Ti(OiPr)_4$ or $Ti(OiPR)_2(DPM)_2$, is supplied by bubbling from the Ti source material reservoir 53 heated by the heater 77, and is delivered from the showerhead 40 onto the semiconductor wafer W inside the process chamber 1 (Step 1). In this case, the Ti source material reservoir 53 is heated to a temperature of about 50 to 70° C. for $Ti(OiPr)_4$ or about 150 to 230° C. for $Ti(OiPR)_2(DPM)_2$. When the Ti source material is thus supplied, the Ti source material is uniformly adsorbed on the surface of the semiconductor wafer W. At this time, the diluting gas, such Ar gas, is supplied from the diluting gas supply source 55 at a flow rate of about 100 to 500 mL/min (sccm), and the carrier gas, such Ar gas, is supplied from the carrier gas supply source 71 at a flow rate of about 100 to 500 mL/min (sccm). This step is performed for a time period of, e.g., about 0.1 to 20 sec.

Then, the carrier gas is stopped to stop the supply of the Ti source material, and the diluting gas, such Ar gas, is supplied from the diluting gas supply source 55 at a flow rate of 200 to 1,000 mL/min (sccm) into the process chamber 1 to purge the interior of the process chamber (Step 2). This step is performed for a time period of, e.g., about 0.1 to 20 sec.

Then, while the diluting gas, such Ar gas, is supplied from the diluting gas supply source 55 at a flow rate of about 100 to 500 mL/min (sccm), the oxidizing agent is supplied from the oxidizing agent supply source 54, and is delivered from the showerhead 40 onto the semiconductor wafer W inside the process chamber 1 (Step 3). Accordingly, the Ti source material adsorbed on the surface of the semiconductor wafer W is decomposed and oxidized, thereby forming a $TiO_x$ film. This step is performed for a time period of, e.g., about 0.1 to 20 sec. As described above, the oxidizing agent may be $O_3$ gas, $O_2$ gas, $H_2O$, or $O_2$ gas plasma, and is preferably $H_2O$. Where the oxidizing agent is $O_3$ gas that is highly oxidative, $Sr(C_5(CH_3)_5)_2$ is rapidly oxidized and generates $SrCO_3$. This $SrCO_3$ remains in an $SrTiO_3$ film as a hetero-phase (impurity) and brings about poor smoothness. On the other hand, where the oxidizing agent is $H_2O$, generation of $SrCO_3$ is suppressed, and thereby increases the purity of an $SrTiO_3$ film. Where the oxidizing agent is $H_2O$, the flow rate is preferably set to be about 2 to 50 mL/min (sccm). Where the oxidizing agent is $O_3$ gas, an ozonizer is used as the oxidizing agent supply source 54 with a supply rate of about 50 to 200 $g/Nm^3$. In this case, $O_2$ gas may be used along with $O_3$ gas while the flow rate of $O_2$ gas is set to be about 100 to 1,000 mL/min (sccm).

Then, the supply of the oxidizing agent is stopped, and the diluting gas is supplied from the diluting gas supply source 55 by use of the same conditions as Step 2 into the process chamber 1 to purge the interior of the process chamber (Step 4).

Then, the Sr source material, such $Sr(C_5(CH_3)_5)_2$ described above, is supplied by bubbling from the Sr source material reservoir 52 heated to a temperature of about 150 to 230° C. by the heater 76, and is delivered from the showerhead 40 onto the semiconductor wafer W inside the process chamber 1 (Step 5). When the Sr source material is thus supplied, the Sr source material is adsorbed on the surface of the $TiO_x$ film. At this time, the diluting gas, such Ar gas, is supplied from the diluting gas supply source 55 at a flow rate of about 100 to 500 mL/min (sccm), and the carrier gas, such Ar gas, is supplied from the carrier gas supply source 66 at a flow rate of about 100 to 500 mL/min (sccm). This step is performed for a time period of, e.g., about 0.1 to 20 sec.

Then, the carrier gas is stopped to stop the supply of the Sr source material, and the diluting gas, such Ar gas, is supplied from the diluting gas supply source 55 by use of the same conditions as Step 2 into the process chamber 1 to purge the interior of the process chamber (Step 6).

Then, while the diluting gas is supplied from the diluting gas supply source 55 by use of the same conditions as Step 3, the oxidizing agent is supplied from the oxidizing agent supply source 54, and is delivered from the showerhead 40 onto the semiconductor wafer W inside the process chamber 1 (Step 7). Accordingly, the Sr source material adsorbed on the surface of the $TiO_x$ film is decomposed and oxidized, thereby forming an $SrO_x$ film.

Then, the supply of the oxidizing agent is stopped, and the diluting gas is supplied from the diluting gas supply source 55 by use of the same conditions as Step 2 into the process chamber 1 to purge the interior of the process chamber (Step 8).

Steps 1 to 8 described above are repeated 20 times or more, such 100 times, so that an $SrTiO_3$ film having a predetermined thickness is formed.

After the film is thus formed, for example, $O_2$ gas is supplied from the oxidizing agent supply source 54 at a predetermined flow rate to sufficiently oxidize the film. Then, all the gases are stopped and the interior of the process chamber is vacuum-exhausted. Then, the semiconductor wafer W is unloaded from the process chamber 1 by a transfer arm.

In the sequence described above, valves and mass-flow controllers are controlled by the process controller 90 in accordance with a recipe stored in the storage section 92.

In the film formation described above, the Sr source material is $Sr(C_5(CH_3)_5)_2$, which has a higher vapor pressure than $Sr(DPM)_2$ that is conventionally used as an Sr source. For example, $Sr(DPM)_2$ has a vapor pressure of 13.3 Pa (0.1 Torr) at 231° C., while $Sr(C_5(CH_3)_5)_2$ has a vapor pressure 2.9 Pa (0.022 Torr) at 150° C., 15.6 Pa (0.12 Torr) at 170° C., and 72 Pa (0.54 Torr) at 190° C. Accordingly, a sufficient amount of gas can be supplied, thereby providing high throughput.

In addition to use of $Sr(C_5(CH_3)_5)_2$ as the Sr source material, an ALD method is adopted such that adsorption of the Ti source material on the semiconductor wafer W, oxidization of the Ti source material, adsorption of the Sr source material, and oxidization of the Sr source material are repeated in this order. In this case, since the Ti source material or Sr source material is adsorbed before the source material is decomposed by the oxidizing agent, the source material is sufficient diffused even to the bottom of holes having a high aspect ratio. Then, the source material is decomposed by the oxidizing agent to form a $TiO_x$ film or $SrO_x$ film. Consequently, the film is formed uniformly from the top surface of holes over to the bottom surface thereof, thereby realizing film formation with good coverage. Further, $TiO_x$ films and $SrO_x$ films having such a uniform thickness are alternately formed, so the chemical composition of the film becomes uniform in the film from the top surface through the side surface to the bottom surface.

Figure 3:
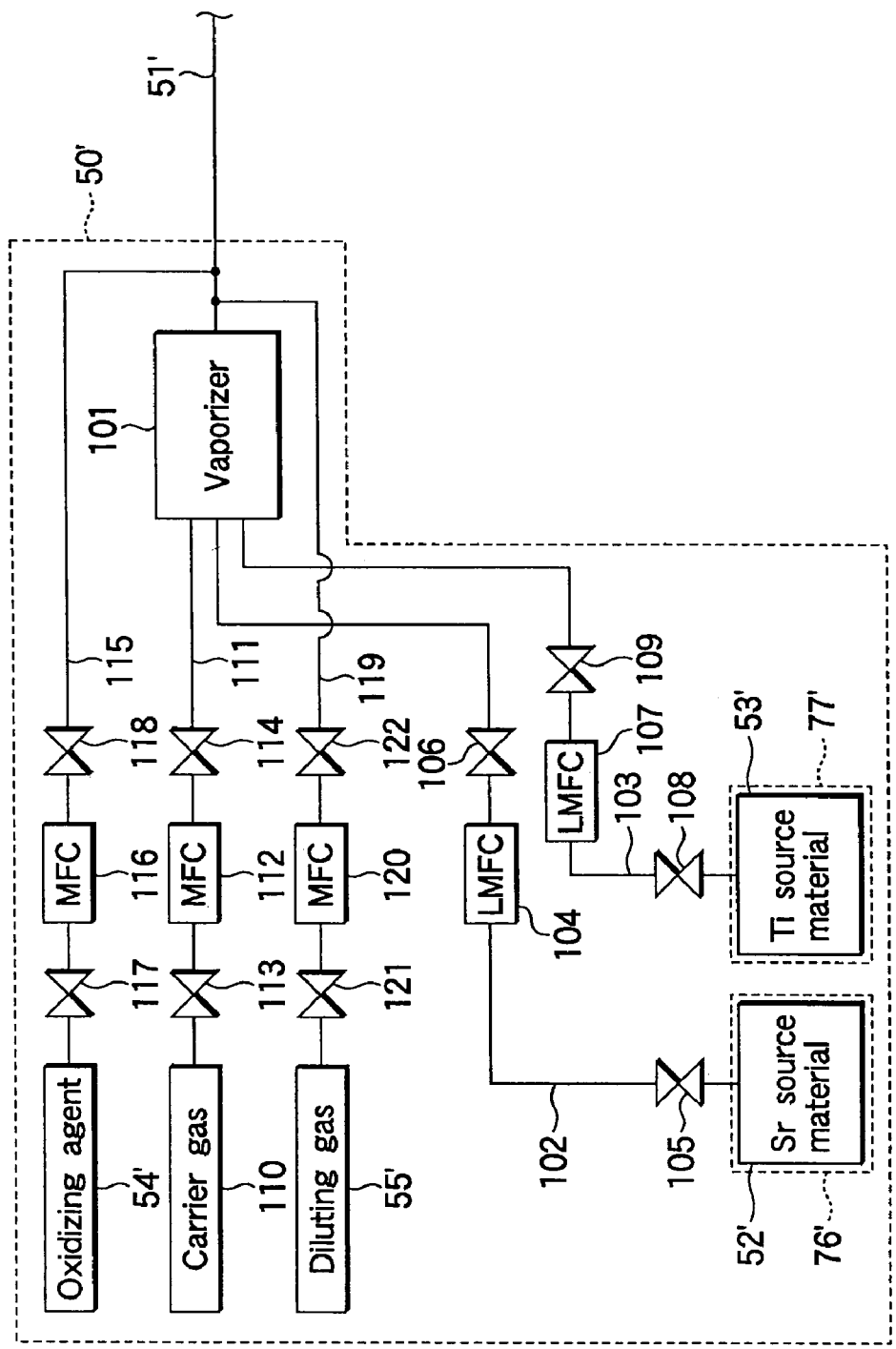
FIG. 3 is a view showing another example of a process gas supply mechanism.

In the film forming apparatus described above, the process gas supply mechanism 50 is arranged to perform source material supply by bubbling. Alternatively, as shown in FIG. 3, a process gas supply mechanism 50' arranged to perform source material supply by use of a vaporizer may be used. The process gas supply mechanism 50' includes an Sr source material reservoir 52' that stores an Sr source material dissolved in a solvent, a Ti source material reservoir 53' that stores a Ti source material dissolved in a solvent, an oxidizing agent supply source 54' for supplying an oxidizing agent, and a vaporizer 101 for vaporizing the Sr source material and Ti source material. The Sr source material reservoir 52' is connected to the vaporizer 101 through a line 102. The Ti source material reservoir 53' is connected to the vaporizer 101 through a line 103. The liquid in each of the Sr source material reservoir 52' and Ti source material reservoir 53' is supplied into the vaporizer 101 by a pressurized gas or a pump. The line 102 is provided with a flow rate controller, such as a liquid mass-flow controller (LMFC) 104, and switching valves 105 and 106 one on either sides of the LMFC 104. The line 103 is provided with a liquid mass-flow controller (LMFC) 107, and switching valves 108 and 109 one on either sides of the LMFC 107. The Sr source material reservoir 52' and Ti source material reservoir 53' are respectively provided with heaters 76' and 77'. The Sr source material dissolved in a solvent in the Sr source material reservoir 52' and the Ti source material dissolved in a solvent in the Ti source material reservoir 53' are heated by the heaters 76' and 77' to predetermined temperatures while they are supplied in a liquid state into the vaporizer 101 by a pressurized gas or a pump. Although not shown, the piping lines for supplying the Sr source material and Ti source material are also provided with heaters.

The vaporizer 101 is connected to the showerhead 40 through a line 51'. The vaporizer 101 is connected through a line 111 to a carrier gas supply source 110 for supplying a carrier gas, such as Ar. Each of the Sr source material and Ti source material is heated to, e.g., 100 to 200° C. and vaporized in the vaporizer 101. The carrier gas is supplied into the vaporizer 101 and carries the source material thus vaporized through the line 51' and showerhead 40 into the process chamber 1. The line 111 is provided with a flow rate controller, such as a mass-flow controller (MFC) 112, and switching valves 113 and 114 one on either sides of the MFC 112. The oxidizing agent supply source 54' is connected to the line 51' through a line 115, so that the oxidizing agent is supplied through the line 115, line 51', and showerhead 40 into the process chamber 1. The line 115 is provided with a flow rate controller, such as a mass-flow controller (MFC) 116, and switching valves 117 and 118 one on either sides of the MFC 116. The gas supply mechanism 50' further includes a diluting gas supply source 55' for supplying a diluting gas, such as argon gas, for diluting the gas inside the process chamber 1. The diluting gas supply source 55' is connected to the line 51' through a line 119, so that diluting argon gas is supplied through the line 119, line 51', and showerhead 40 into the process chamber 1. The line 119 is provided with a flow rate controller, such as a mass-flow controller (MFC) 120, and switching valves 121 and 122 one on either sides of the MFC 120.

Where an $SrTiO_3$ film is formed by use of the gas supply mechanism 50', a film formation process is performed in accordance with a sequence basically the same as that described above, except that it differs in the flow of the Ti source material in Step 1 described above and the flow of the Sr source material in Step 5 described above.

Specifically, in the flow of the Ti source material in Step 1, the Ti source material dissolved in a solvent in the Ti source material reservoir 53' is sent to the vaporizer heated to a temperature of 150 to 230° C. and is thereby vaporized. In this case, the solvent may be an organic solvent that is conventionally used, but the solvent is preferably formed of one containing no oxygen, and is typically formed of a hydrocarbon. Such a solvent is supplied into the vaporizer 101. At this time, the diluting gas, such Ar gas, is supplied from the diluting gas supply source 55' at a flow rate of about 100 to 500 mL/min (sccm), and the carrier gas, such as Ar gas, is supplied from the carrier gas supply source 110 at a flow rate of about 100 to 500 mL/min (sccm). This step is performed for the same time period as in the bubbling supply described above.

In the flow of the Sr source material in Step 5, the Sr source material dissolved in a solvent in the Sr source material reservoir 52' is sent to the vaporizer heated to a temperature of 150 to 230° C. and is thereby vaporized. In this case, the solvent is formed of a compound but is not limited to a specific one. However, if an organic solvent containing oxygen, such as THF, acetone, or acetic acid, is used as a solvent for $Sr(C_5(CH_3)_5)_2$ used as the Sr source material, as disclosed in claim 2 of Patent Document 1 described above, it reacts with $Sr(C_5(CH_3)_5)_2$ and undesirably generates dimers that substantially decrease the vapor pressure, or a substance that has a boiling point different from $Sr(C_5(CH_3)_5)_2$. For example, THF reacts with $Sr(C_5(CH_3)_5)_2$ and generates a new substance, $Sr(C_5(CH_3)_5)_2(THF)_2$. Accordingly, the solvent for $Sr(C_5(CH_3)_5)_2$ used as the Sr source material is preferably formed of an organic solvent containing no oxygen, and is typically formed of a hydrocarbon. It has been found that, of them, toluene is optimum for this purpose. Toluene does not react with $Sr(C_5(CH_3)_5)_2$, but dissolves $Sr(C_5(CH_3)_5)_2$ with a high solvability of 175 g/L. This solvability is far higher as compared to 18 g/L obtained by hexane and 13 g/L obtained by octane, both of which are also hydrocarbons. Where such a high solvability is obtained, the Sr source material can be supplied at a high Sr equivalent weight when the liquid source material is vaporized and then adsorbed on a semiconductor wafer inside the process chamber. Consequently, toluene is preferable to increase the process efficiency, improve the film coverage, and increase the film density. Further, Patent Document 1 described above discloses in claim 6 that an Sr compound having a concentration of 0.01 to 0.09 mol/L is used as an Sr source material. In this respect, where $Sr(C_5(CH_3)_5)_2$ is used as an Sr source material and toluene is used as a solvent, an Sr-containing liquid has a high concentration of 0.489 mol/L, which is 5 to 50 times larger than that of Patent Document 1.

A liquid formed of $Sr(C_5(CH_3)_5)_2$ dissolved in a solvent is supplied into the vaporizer 101. At this time, the diluting gas, such Ar gas, is supplied from the diluting gas supply source 55' at a flow rate of about 100 to 500 mL/min (sccm), and the carrier gas, such Ar gas, is supplied from the carrier gas supply source 110 at a flow rate of about 100 to 500 mL/min (sccm). This step is performed for the same time period as in the bubbling supply described above.

Also in this case where the Sr source material and Ti source material are supplied by use of a vaporizer, Steps 1 to 8 described above are repeated 20 times or more, such 100 times, so that an $SrTiO_3$ film having a predetermined thickness is formed.

Thereafter, $O_2$ gas flow and the other gases are stopped and the interior of the process chamber is vacuum-exhausted, as in the former case. Then, the semiconductor wafer W is unloaded from the process chamber 1.

It may be designed such that one of the Sr source material reservoir and Ti source material reservoir is of the bubbling type, and the other is of the vaporizer type.

Next, an explanation will be given of experiments of film formation performed by use of present examples according to the embodiment described above and comparative examples.

PRESENT EXAMPLE PE1

In the apparatus shown in FIG. 1, the lamp power was adjusted to set the temperature of the worktable at a film formation temperature of 320° C. An Si wafer of 200 mm was loaded by a transfer robot arm into the process chamber. Then, film formation was performed to form an $SrTiO_3$ film. $Sr(C_5(CH_3)_5)_2$ used as an Sr source material was stored in a container heated to 150° C., and supplied into the process chamber by bubbling with Ar gas used as a carrier gas. Ti(O-iPr)$_4$ used as a Ti source material was stored in a container heated to 40° C., and supplied into the process chamber by bubbling with Ar gas used as a carrier gas. $H_2O$ was used as an oxidizing agent. The temperature of the piping lines and process chamber was set at 155° C. After the Si wafer was placed on the worktable by the arm, while diluting Ar gas was supplied at a flow rate of 300 mL/min (sccm) for 30 sec, and the pressure was set at 133 Pa (1 Torr), the temperature of the Si wafer was increased to the film formation temperature. Then, while the diluting gas was maintained at the same flow rate, the pressure was adjusted for 10 sec to a film formation pressure of 40 Pa (0.3 Torr). Then, film formation was performed in accordance with Steps 1 to 8 described above.

Step 1 of Ti source material supply was performed for a time period of 2 sec while carrier Ar gas was supplied at a flow rate of 100 mL/min (sccm) and diluting Ar gas was supplied at a flow rate of 100 mL/min (sccm). Step 2 of Ar gas purge was performed for a time period of 1 sec while diluting Ar gas was supplied at a flow rate of 500 mL/min (sccm) after the supply of carrier Ar gas was stopped.

Step 3 of oxidizing agent supply was performed for a time period of 2 sec while $H_2O$ vapor used as an oxidizing agent was supplied at a flow rate of 10 mL/min (sccm) and diluting Ar gas was supplied at a flow rate of 190 mL/min (sccm). At this time, $H_2O$ was deoxidized by bubbling with Ar gas within an inactive gas atmosphere, and then heated to 40° C. to generate $H_2O$ vapor. Then, the $H_2O$. vapor thus generated was supplied as the oxidizing agent at the flow rate described above by use of a high temperature mass-flow controller heated to 50° C. Step 4 of Ar gas purge was performed for a time period of 1 sec while diluting Ar gas was supplied at a flow rate of 500 mL/min (sccm) as in Step 2 after the supply of $H_2O$ was stopped.

Step 5 of Sr source material supply was performed for a time period of 2 sec while carrier Ar gas was supplied at a flow rate of 50 mL/min (sccm) and diluting Ar gas was supplied at a flow rate of 100 mL/min (sccm). Step 6 of Ar gas purge was performed for a time period of 1 sec while diluting Ar gas was supplied at a flow rate of 500 mL/min (sccm) as in Step 2 after the supply of carrier Ar gas was stopped.

Step 7 of oxidizing agent supply and Step 8 of Ar gas purge were performed by use of the same conditions as Step 3 and Step 4.

After Steps 1 to 8 were repeated 100 times, $O_2$ gas was supplied at a flow rate 300 mL/min (sccm) for 20 sec, while the pressure was maintained at the film formation pressure. Then, the gas was stopped and the interior of the process chamber was vacuum-exhausted at full load for 20 sec. Thereafter, the Si wafer was unloaded from the process chamber.

The thickness of the $SrTiO_3$ film formed by the sequence described above was measured and found to be 12 nm. The C content in the film was measured by SIMS and found to be $1.5 \times 10^{21}$ cm$^3$. This C content as an impurity in the $SrTiO_3$ film was lower than that obtained by Present example PE4 using $O_3$ gas as an oxidizing agent, as described later.

PRESENT EXAMPLE PE2

An $SrTiO_3$ film was formed by use of the same conditions as Present example PE1 except that the film formation temperature was set at 340° C. and the film formation pressure was set at 93 Pa (0.7 Torr). The thickness of the $SrTiO_3$ film thus formed was measured and found to be 11 nm. The C content in the film was measured by SIMS and found to be $0.7 \times 10^{21}$ cm$^3$. As in Present example PE1, this C content as an impurity in the $SrTiO_3$ film was lower than that obtained by Present example PE4 described later.

PRESENT EXAMPLE PE3

In the apparatus shown in FIG. 1, the lamp power was adjusted to set the temperature of the worktable at a film formation temperature of 330° C. An Si wafer of 200 mm was loaded by a transfer robot arm into the process chamber. Then, film formation was performed to form an $SrTiO_3$ film. $Sr(C_5(CH_3)_5)_2$ used as an Sr source material was dissolved in toluene at a concentration of 0.489 mol/L, and supplied by pressurized He into the vaporizer heated to 150° C. With Ar gas used as a carrier gas, the Sr source material was vaporized in a vaporizer, and supplied into the process chamber. Ti(O-iPr)$_4$ used as a Ti source material was stored in a container heated to 40° C, and supplied into the process chamber by bubbling with Ar gas used as a carrier gas. $H_2O$ was used as an oxidizing agent. The temperature of the piping lines and process chamber was set at 155° C. After the Si wafer was placed on the worktable by the arm, while diluting Ar gas was supplied at a flow rate of 300 mL/min (sccm) for 30 sec, and the pressure was set at 133 Pa (1 Torr), the temperature of the Si wafer was increased to the film formation temperature. Then, while the diluting gas was maintained at the same flow rate, the pressure was adjusted for 10 sec to a film formation pressure of 106 Pa (0.8 Torr). Then, film formation was performed in accordance with Steps 1 to 8 described above.

Steps 1 to 4 were performed by use of the same conditions as Steps 1 to 4 of Present example PE1 except for the film formation pressure. Then, Step 5 of Sr source material supply was performed for a time period of 2 sec while carrier Ar gas was supplied at a flow rate of 50 mL/min (sccm) and diluting Ar gas was supplied at a flow rate of 100 mL/min (sccm), so that $Sr(C_5(CH_3)_5)_2$ dissolved in toluene was vaporized in the vaporizer. Step 6 of Ar gas purge was performed for a time period of 1 sec while diluting Ar gas was supplied at a flow rate of 500 mL/min (sccm) as in Step 2 after the supply of carrier Ar gas was stopped.

Step 7 of oxidizing agent supply and Step 8 of Ar gas purge were performed by use of the same conditions as Step 3 and Step 4.

After Steps 1 to 8 were repeated 100 times, $O_2$ gas was supplied at a flow rate 300 mL/min (sccm) for 20 sec, while the pressure was maintained at the film formation pressure. Then, the gas was stopped and the interior of the process chamber was vacuum-exhausted at full load for 20 sec. Thereafter, the Si wafer was unloaded from the process chamber.

The thickness of the $SrTiO_3$ film formed by the sequence described above was measured and found to be 13 nm. The C content in the film was measured by SIMS and found to be $0.8 \times 10^{21}$ cm$^3$. As in Present examples PE1 and PE2, this C content as an impurity in the $SrTiO_3$ film was lower than that obtained by Present example PE4 described later. Further, the film coverage was preferable for a hole having a high aspect ratio with a diameter of 0.1 μm and a depth of 3 μm such that the thickness thereof was 13 nm on the top surface, 12.1 nm on a side surface at a depth of 2 μm, and 11.5 nm on the bottom surface. The composition of the film on the hole was analyzed by EDAX and found that composition uniformity was preferable such that the ratio of the number of atoms was Sr:Ti=1:0.9 on the top surface, Sr:Ti=1:1.12 at a depth of 2 μm, and Sr:Ti=1:0.95 on the bottom surface.

PRESENT EXAMPLE PE4

An $SrTiO_3$ film was formed by use of the same conditions as Present example PE1 except that the oxidizing agent was $O_3$ gas. Step 3 of oxidizing agent supply was performed for a time period of 2 sec while $O_3$ gas was set at 200 g/Nm$^3$, $O_2$ gas was set at 1,000 mL/min (sccm), and diluting Ar gas was set at a flow rate of 100 mL/min (sccm). The thickness of the $SrTiO_3$ film thus formed was measured and found to be 13 nm. The C content in the film was measured by SIMS and found to be $1.2 \times 10^{22}$ cm$^3$. This C content remaining in the film was higher to some extent than those obtained by Present examples PE1 to PE3 using $H_2O$ as an oxidizing agent.

COMPARATIVE EXAMPLE CE1

In the apparatus shown in FIG. 1, the lamp power was adjusted to set the temperature of the worktable at a film formation temperature of 320° C. An Si wafer of 200 mm was loaded by a transfer robot arm into the process chamber. Then, film formation was performed to form an SrTiO$_3$ film. Sr(DPM)$_2$ used as an Sr source material was stored in a container heated to 200° C., and supplied into the process chamber by bubbling with Ar gas used as a carrier gas. Ti(O-iPr)$_4$ used as a Ti source material was stored in a container heated to 40° C., and supplied into the process chamber by bubbling with Ar gas used as a carrier gas. O$_3$ gas was used as an oxidizing agent. The temperature of the piping lines and process chamber was set at 180° C. After the Si wafer was placed on the worktable by the arm, while diluting Ar gas was supplied at a flow rate of 300 mL/min (sccm) for 30 sec, and the pressure was set at 133 Pa (1 Torr), the temperature of the Si wafer was increased to the film formation temperature. Then, while the diluting gas was maintained at the same flow rate, the pressure was adjusted for 10 sec to a film formation pressure of 40 Pa (0.3 Torr). Then, film formation was performed in accordance with Steps 1 to 8 described above.

Step 1 of Ti source material supply was performed for a time period of 2 sec while carrier Ar gas was supplied at a flow rate of 100 mL/min (sccm) and diluting Ar gas was supplied at a flow rate of 100 mL/min (sccm). Step 2 of Ar gas purge was performed for a time period of 1 sec while diluting Ar gas was supplied at a flow rate of 500 mL/min (sccm) after the supply of carrier Ar gas was stopped.

Step 3 of oxidizing agent supply was performed for a time period of 2 sec while O$_3$ gas was set at 200 g/Nm$^3$ and diluting Ar gas was set at a flow rate of 1,000 mL/min (sccm). Step 4 of Ar gas purge was performed for a time period of 1 sec while diluting Ar gas was supplied at a flow rate of 500 mL/min (sccm) as in Step 2 after the supply of O$_3$ gas was stopped.

Step 5 of Sr source material supply was performed for a time period of sec while carrier Ar gas was supplied at a flow rate of 50 mL/min (sccm) and diluting Ar gas was supplied at a flow rate of 100 mL/min (sccm). Step 6 of Ar gas purge was performed for a time period of 1 sec while diluting Ar gas was supplied at a flow rate of 500 mL/min (sccm) as in Step 2 after the supply of carrier Ar gas was stopped.

Step 7 of oxidizing agent supply and Step 8 of Ar gas purge were performed by use of the same conditions as Step 3 and Step 4.

After Steps 1 to 8 were repeated 100 times, O$_2$ gas was supplied at a flow rate 300 mL/min (sccm) for 20 sec, while the pressure was maintained at the film formation pressure. Then, the gas was stopped and the interior of the process chamber was vacuum-exhausted at full load for 20 sec. Thereafter, the Si wafer was unloaded from the process chamber.

The thickness of the SrTiO$_3$ film formed by the sequence described above was measured and found to be 3 nm, which was smaller than those obtained by the Present examples. This is thought to be due to the fact that the Sr source material was Sr(DPM)$_2$ having a lower vapor pressure, so the Sr supply amount obtained by bubbling at 200° C. was insufficient.

COMPARATIVE EXAMPLE PE2

An SrTiO$_3$ film was formed by use of the same conditions as Comparative example PE1 except that the film formation temperature was set at 350° C. and each of Sr(DPM)$_2$ used as an Sr source material and Ti(OiPr)$_4$ used as a Ti source material was dissolved in THF and vaporized in a vaporizer for supply, while the source material containers and the vaporizer was heated to 310° C. and the film formation pressure was set at 133 Pa (1 Torr). The thickness of the SrTiO$_3$ film thus formed was measured and found to be 6 nm, which was larger than that that obtained by Comparative example CE1 and smaller than those obtained by the Present examples. This is thought to be due to the fact that, although the vaporizer temperature was high enough to obtain a sufficient vaporization amount, the temperature of the piping lines and process chamber was 180° C. and causes Sr(DPM)$_2$ to be re-solidified on the wall of the piping lines and process chamber, thereby decreasing the amount of the source material reaching the wafer.

COMPARATIVE EXAMPLE CE3

An SrTiO$_3$ film was formed by use of the same conditions as Comparative example PE2 except that the temperature of the piping lines and process chamber was set at 320° C. As a result, the thickness of the film thus formed was 12 nm, which was very close to those obtained by the Present examples. However, it was necessary to use highly heat-resistant component members because of the higher temperature of the piping lines and process chamber, such that the resin valves were replaced with all metal valves, the material of the process chamber was changed from aluminum to stainless steel, and the material of the showerhead was changed from aluminum to HASTELLOY™. Consequently, the equipment cost became too high to realize a practical apparatus.

COMPARATIVE EXAMPLE CE4

Film formation was performed by use of conditions corresponding to those described in Patent Document 1. The temperature of the worktable was set at a film formation temperature of 600° C. by lamp heating. An Si wafer of 200 mm was loaded by a transfer robot arm into the process chamber. Then, film formation was performed to form an SrTiO$_3$ film. Sr(C$_5$(CH$_3$)$_5$)$_2$ used as an Sr source material was dissolved in THF and stored in a container heated to 130° C. The Sr source material was vaporized in a vaporizer heated to 130° C., and supplied into the process chamber. Ti(OiPr)$_4$ used as a Ti source material was stored in a container heated to 40° C., and supplied into the process chamber by bubbling with Ar gas used as a carrier gas. O$_2$ was used as an oxidizing agent. The temperature of the piping lines and process chamber was set at 135° C. The Sr source material, Ti source material, oxidizing agent were supplied into the process chamber at the same time. The film formation pressure was maintained at 1,333 Pa (10 Torr). In this state, film formation was performed by CVD for 600 sec.

The thickness of the SrTiO$_3$ film thus formed was measured and found to be a small value of 4 nm. In this example, although Sr(C$_5$(CH$_3$)$_5$)$_2$ was used, the material was dissolved in THF and reacted therewith, so a new substance, Sr(C$_5$(CH$_3$)$_5$)$_2$(THF)$_2$, was produced and the amount of Sr contributing to film formation was thereby decreased. Further, the film formation was performed by a CVD method, the coverage and composition uniformity of the film were poor. Specifically, for a hole having a high aspect ratio with a diameter of 0.1 μm and a depth of 3 μm, the thickness of the film was 4 nm on the top surface and 1 nm on a side surface at a depth of 0.5 μm. The composition of the film on the hole was analyzed by EDAX and found that the ratio of the number of atoms was Sr:Ti=1:0.9 on the top surface and Sr:Ti=1:5 at a depth of 0.3 μm.

FIG. 4 shows results obtained by Present examples PE1 to PE4 and Comparative examples CE1 to CE4 described above. In FIG. 4, "TG1" denotes the temperature of the Sr source material reservoir or vaporizer, "TP" denotes the temperature of the piping lines and process chamber, and "TG2" denotes the temperature of the Ti source material reservoir or vaporizer.

According to the embodiment described above, the Sr source material is $Sr(C_5(CH_3)_5)_2$ having a higher vapor pressure than $Sr(DPM)_2$, so the material can be supplied at a sufficient rate, thereby increasing the throughput. Since the source material has a higher vapor pressure, it can be sufficiently gasified even at a temperature of 200° C. or less. In addition to use of $Sr(C_5(CH_3)_5)_2$ as the Sr source material, an ALD method is adopted such that adsorption of the Ti source material on the substrate, oxidization of the Ti source material, adsorption of the Sr source material, and oxidization of the Sr source material are repeated in this order. In this case, since the Ti source material or Sr source material is adsorbed before the source material is decomposed by the oxidizing agent, the source material is sufficient diffused even to the bottom of holes having a high aspect ratio. Then, the source material is decomposed by the oxidizing agent to form a $TiO_x$ film or $SrO_x$ film. Consequently, the film is formed uniformly from the top surface of holes over to the bottom surface thereof, thereby realizing film formation with good coverage. Further, $TiO_x$ films and $SrO_x$ films having such a uniform thickness are alternately formed, so the chemical composition of the film becomes uniform in the film from the top surface through the side surface to the bottom surface.

The present invention is not limited to the embodiment described above, and it may be modified in various manners.

For example, the film forming apparatus is of the type that heats a target substrate by lamp heating, but it may be of the type that uses a resistant heating heater. In the embodiment described above, the target substrate is a semiconductor wafer, but it may be another substrate, such as an FPD glass substrate.

A method for forming an $SrTiO_3$ film according to the present invention can form a high quality film with high throughput and high coverage, so the method can be preferably applied to formation of the electrode of a capacitor having an MIM structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An $SrTiO_3$ film forming method for forming an $SrTiO_3$ film on a substrate placed and heated inside a process chamber while supplying a gaseous Ti source material, a gaseous Sr source material, and a gaseous oxidizing agent into the process chamber, wherein $Sr(C_5(CH_3)_5)_2$ is used as the Sr source material, $H_2O$ pretreated by deoxidization is used as the gaseous oxidizing agent, and the method is arranged to perform a plurality of cycles to laminate thin films respectively formed by the cycles, thereby forming the $SrTiO_3$ film with a predetermined thickness, each of the plurality of cycles sequentially comprising:
   supplying the gaseous Ti source material into the process chamber and thereby adsorbing the gaseous Ti source material onto the substrate;
   supplying the gaseous oxidizing agent into the process chamber and thereby decomposing and oxidizing the Ti source material thus adsorbed and forming a Ti-containing oxide film;
   supplying the gaseous Sr source material into the process chamber and thereby adsorbing the gaseous Sr source material onto the Ti-containing oxide film; and
   supplying the gaseous oxidizing agent into the process chamber and thereby decomposing and oxidizing the Sr source material thus adsorbed and forming an Sr-containing oxide film.

2. The $SrTiO_3$ film forming method according to claim 1, wherein each of the plurality of cycles further comprises purging an interior of the process chamber between said supplying steps.

3. The $SrTiO_3$ film forming method according to claim 1, wherein the Sr source material is supplied by bubbling while being heated to a temperature of 150 to 230° C.

4. The $SrTiO_3$ film forming method according to claim 1, wherein the Sr source material is dissolved in a solvent, and vaporized in a vaporizer for supply while being heated to a temperature of 150 to 230° C.

5. The $SrTiO_3$ film forming method according to claim 4, wherein the solvent contains no oxygen.

6. The $SrTiO_3$ film forming method according to claim 5, wherein the solvent is a hydrocarbon.

7. The $SrTiO_3$ film forming method according to claim 6, wherein the solvent is toluene.

8. A computer readable storage medium that stores a control program for execution on a computer for controlling a film forming apparatus, wherein the control program, when executed, causes the computer to control the film forming apparatus to perform an $SrTiO_3$ film forming method for forming an $SrTiO_3$ film on a substrate placed and heated inside a process chamber while supplying a gaseous Ti source material, a gaseous Sr source material, and a gaseous oxidizing agent into the process chamber, wherein $Sr(C_5(CH_3)_5)_2$ is used as the Sr source material, $H_2O$ pretreated by deoxidization is used as the gaseous oxidizing agent, and the method is arranged to perform a plurality of cycles to laminate thin films respectively formed by the cycles, thereby forming the $SrTiO_3$ film with a predetermined thickness, each of the plurality of cycles sequentially comprising:
   supplying the gaseous Ti source material into the process chamber and thereby adsorbing the gaseous Ti source material onto the substrate;
   supplying the gaseous oxidizing agent into the process chamber and thereby decomposing and oxidizing the Ti source material thus adsorbed and forming a Ti-containing oxide film;
   supplying the gaseous Sr source material into the process chamber and thereby adsorbing the gaseous Sr source material onto the Ti-containing oxide film; and
   supplying the gaseous oxidizing agent into the process chamber and thereby decomposing and oxidizing the Sr source material thus adsorbed and forming an Sr-containing oxide film.

9. An $SrTiO_3$ film forming method for forming an $SrTiO_3$ film in a hole present on a surface of a substrate placed inside a process chamber by performing a plurality of cycles using a film formation temperature of 200 to 400° C. on the substrate and a film formation pressure of 39 to 266 Pa inside the process chamber to laminate thin films respectively formed by the plurality of cycles, thereby forming the $SrTiO_3$ film with a predetermined thickness in the hole, each of the plurality of cycles sequentially comprising:
   supplying a gaseous Ti source material, obtained by bubbling or vaporizing a liquid containing $Ti(OiPr)_4$ or $Ti(OiPr)_2(DPM)_2$, into the process chamber and thereby adsorbing the gaseous Ti source material onto the substrate;
   supplying $H_2O$ vapor pretreated by deoxidization into the process chamber while not turning the $H_2O$ vapor into plasma, and thereby decomposing and oxidizing the Ti source material thus adsorbed and forming a Ti-containing oxide film;

supplying a gaseous Sr source material, obtained by bubbling or vaporizing a liquid containing $Sr(C_5(CH_3)_5)_2$, into the process chamber and thereby adsorbing the gaseous Sr source material onto the substrate; and supplying $H_2O$ vapor pretreated by deoxidization into the process chamber while not turning the $H_2O$ vapor into plasma, and thereby decomposing and oxidizing the Sr source material thus adsorbed and forming an Sr-containing oxide film.

10. The $SrTiO_3$ film forming method according to claim 9, wherein each of the plurality of cycles further comprises purging an interior of the process chamber between said supplying steps.

11. The $SrTiO_3$ film forming method according to claim 9, wherein the Sr source material is supplied by bubbling while being heated to a temperature of 150 to 230° C.

12. The $SrTiO_3$ film forming method according to claim 9, wherein the Sr source material is dissolved in a solvent, and vaporized in a vaporizer for supply while being heated to a temperature of 150 to 230° C.

13. The $SrTiO_3$ film forming method according to claim 12, wherein the solvent contains no oxygen.

14. The $SrTiO_3$ film forming method according to claim 13, wherein the solvent is a hydrocarbon.

15. The $SrTiO_3$ film forming method according to claim 14, wherein the solvent is toluene.

* * * * *